(12) United States Patent
Eslamy

(10) Patent No.: US 6,784,536 B1
(45) Date of Patent: Aug. 31, 2004

(54) SYMMETRIC STACK UP STRUCTURE FOR ORGANIC BGA CHIP CARRIERS

(75) Inventor: Mohammad Eslamy, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/938,075

(22) Filed: Aug. 23, 2001

Related U.S. Application Data
(60) Provisional application No. 60/254,438, filed on Dec. 8, 2000.

(51) Int. Cl.[7] ............................ H01L 23/10; H01L 23/06
(52) U.S. Cl. ........................ 257/706; 257/729; 257/738; 257/762; 257/796; 257/678; 257/712
(58) Field of Search ................................ 257/706, 729, 257/738, 762, 796, 678, 712, 792, 720, 747, 717, 675

(56) References Cited

U.S. PATENT DOCUMENTS

| | | | |
|---|---|---|---|
| 4,383,270 A | * | 5/1983 | Schelhorn ..................... 357/71 |
| 5,491,362 A | * | 2/1996 | Hamzehdoost et al. ..... 257/712 |
| 5,888,884 A | * | 3/1999 | Wojnarowski ............... 438/462 |
| 6,163,458 A | * | 12/2000 | Li ............................... 361/704 |
| 6,288,900 B1 | * | 9/2001 | Johnson et al. ............. 361/705 |
| 6,294,831 B1 | * | 9/2001 | Shishido et al. ............ 257/729 |

OTHER PUBLICATIONS

R. Tummala et al., Microelectronics Packaging Handbook, Part II, Semiconductor Packaging, (Second Edition, 1997) pp. 78–81, 165–169 and 305–311.

* cited by examiner

*Primary Examiner*—Jerome Jackson
*Assistant Examiner*—Joseph Nguyen
(74) *Attorney, Agent, or Firm*—Morgan Lewis & Bockius LLP

(57) ABSTRACT

An improved structure for an organic ball-grid array chip carrier having an organic substrate attached to a metal heat sink plate to prevent the chip carrier from warping. A supplemental organic substrate is attached to the metal heat sink plate on the side opposite from the functional organic substrate to provide symmetry to the bending forces resulting from the mismatch in coefficients of thermal expansion between the organic substrate and the metal heat sink plate.

8 Claims, 2 Drawing Sheets

SYMMETRIC STACK UP STRUCTURE FOR ORGANIC BGA CHIP CARRIERS

This application claims priority to the provisional patent application entitled, "Symmetric Stack Up Structure For BGA/Flip Chip Products," serial No. 60/254,438, filed on Dec. 8, 2000.

BRIEF DESCRIPTION OF THE INVENTION

The present invention relates generally to the field of semiconductor packaging. More specifically, the present invention relates to an improved structure for organic ball-grid array (BGA) chip carriers having metal heat sink plates.

BACKGROUND OF THE INVENTION

One of the popular BGA chip carriers available in the semiconductor packaging industry is an organic substrate utilizing cavity die-attach configuration. This type of chip carrier is typically constructed with an organic substrate having a multi-layer structure attached to a metal heat sink plate using an adhesive.

The organic substrate may be constructed from materials such as Bis-malesimide triazine epoxy (BT), FR4, polyimide, and polytetrafluoroethlyne. The metal heat sink plate (a.k.a "heatslug") dissipates heat away from the semiconductor die and is usually made of a metal or metal alloy with relatively high thermal conductivity, such as Cu, Al, and Cu—W.

The organic substrate has an opening in the center that forms a die-attach cavity when the substrate is attached to the metal heat sink plate. A semiconductor die is placed within the die-attach cavity and attached to the metal heat sink plate using a thermally conductive adhesive such as silver epoxy. The die-attach cavity opening may typically be a square or a rectangular opening that would be appropriate to accommodate the particular die being attached to the substrate.

The semiconductor die is typically placed within the die-attach cavity with its active side facing out so that wirebond wires can form electrical interconnections between the die and the organic substrate. The wirebond wires connect bonding pads on the semiconductor die to corresponding bonding pads on the substrate and are typically ultrasonically bonded to the bonding pads. A glob-top epoxy sealant is then used to encapsulate the semiconductor die and the wirebond wires.

One of the concerns associated with chip carriers described above is that the difference in coefficients of thermal expansion (CTE) of the metal heat sink plate and the organic substrate results in warping of the chip carrier post-assembly. During the high-temperature curing step for the adhesive used to attach the organic substrate to the metal heat sink plate, the organic substrate expands more than the metal heat sink plate. As the adhesive cures, the organic substrate and the metal heat sink plate are fixated in this state where the organic substrate has expanded more than the metal heat sink plate. Upon subsequent cooling of the assembly, the organic substrate contracts more than the metal heat sink plate, causing the chip carrier assembly to warp.

Some examples of the adhesives that may be used to attach the organic substrate to the metal heat sink plate are: epoxy based adhesives, acrylic, and pre-preg. The curing temperatures for these adhesives are typically in the rage of 150–300 deg. C.

The chip carrier assembly warping poses manufacturability problems because under the current JEDEC standards for electronic packages, a package may not warp more than 0.008 inches. Although, the warping problem could be minimized or eliminated by increasing the thickness of the metal heat sink plate, thereby increasing the chip carrier assemblies' stiffness, it is not practicable because also under the current JEDEC standards, the maximum thickness allowed for metal heat sink plates is only 1.0 mm, which is not sufficient to prevent chip carrier assemblies from warping.

SUMMARY OF THE INVENTION

To address the warping problem with organic cavity die-attach BGA chip carriers, the present invention utilizes a second organic substrate structure (the "supplemental substrate") to counter balance the bending force resulting from the mismatch of CTEs between the main organic substrate (the "primary substrate") and the metal heat sink plate. The supplemental substrate is attached to the metal heat sink plate on the side opposite from the primary substrate resulting in a symmetrically stacked up structure with the metal heat sink plate sandwiched between the two organic substrate structures.

The supplemental substrate is preferably constructed from materials having a CTE that is substantially similar to the CTE of the primary substrate. The supplemental substrate preferably has as many physical characteristics of the primary substrate as possible and may also include a Cu core layer found in the primary substrate to better match the CTE of the primary substrate. More preferably, the supplemental substrate may be constructed from the same organic material as the primary substrate.

The supplemental substrate may also have a hole in the center that mirrors the die-attach cavity in the primary substrate. The hole exposes a portion of the metal heat sink plate for improved heat dissipation. If necessary, supplemental heat dissipating structures such as metal fins may be attached to the exposed portion of the metal heat sink plate.

Because the supplemental substrate, constructed from the same material as the primary substrate, has a CTE that is substantially similar to that of the primary substrate, the symmetrical stack up structure provides symmetry in the thermal expansion of the structures on the two sides of the metal heat sink plate, thus, preventing the assembly from warping.

BRIEF DESCRIPTION OF THE DRAWINGS

For a better understanding of the invention, reference should be made to the following detailed description taken in conjunction with the accompanying drawings, in which.

The drawings are only schematic and are not to scale.

DETAILED DESCRIPTION OF THE INVENTION

The following detailed description of the present invention is for illustrative purposes and should not be construed to limit the invention to these examples.

Figure 1:
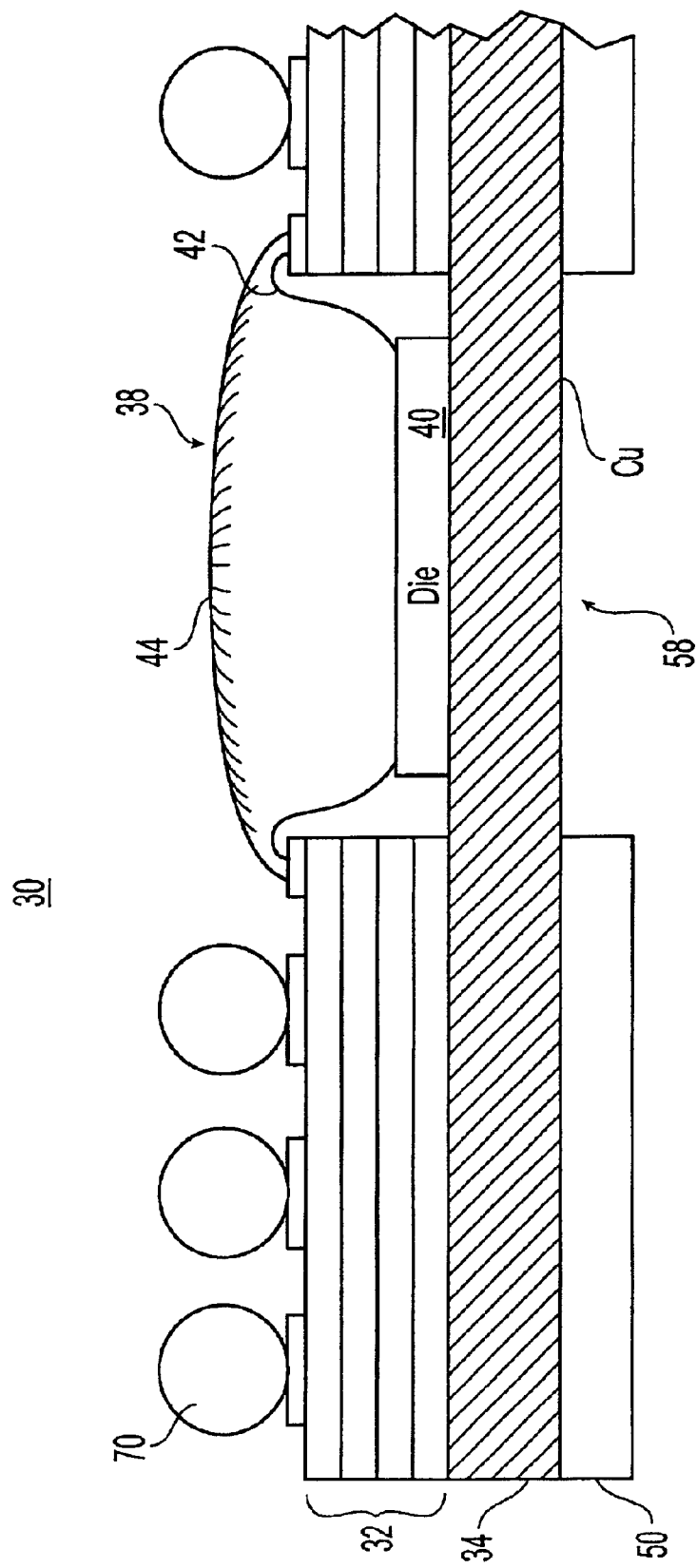
FIG. 1 illustrates a cross-sectional view of a semiconductor chip carrier having the symmetric structure according to the present invention.

In an embodiment of the invention illustrated in FIG. 1, a cross-section of an organic BGA chip carrier 30 with a cavity die-attach configuration is shown. A multi-layer organic substrate 32, the primary substrate, having BGA solder balls 70 is attached to one side of a Cu heat sink plate 34. The primary substrate has internal wiring and it provides the electrical interconnection between the semiconductor die and the next level packaging, typically a printed circuit board, through BGA solder balls 70.

Primary substrate 32 has a hole which forms a die-attach cavity 38 within which a semiconductor die 40 sits. Semiconductor die 40 is physically attached to the Cu heat sink plate and electrically connected to the primary substrate 32 by wirebond wires 42 and then encapsulated with glob-top epoxy 44. The primary substrate may be attached to the Cu heat sink plate using adhesives such as epoxy based adhesives, acrylic, or pre-preg. To enhance the adhesion between the organic substrates and the Cu heat sink plate, the Cu surface may be chemically treated to form a layer of black oxide ($Cu$—$SO_4$).

On the other side of Cu heat sink plate 34 is attached a supplemental substrate 50 whose primary purpose is a structural one. Supplemental substrate 50 is preferably constructed from a material having a CTE that is substantially similar to the CTE of the primary substrate so that the resulting chip carrier has a symmetry about the Cu heat sink plate, i.e., the Cu heat sink plate is sandwiched between two organic substrates having substantially similar CTEs.

In the resulting symmetrically stacked up structure, the CTE of supplemental substrate 50 is substantially similar to the CTE of the primary substrate. In this structure, the bending force created by the mismatch of CTEs between the primary substrate and the Cu heat sink plate is counterbalanced by the mismatch of CTEs between the supplemental substrate and the Cu heat sink plate. Thus, this symmetry eliminates or substantially minimizes the chip carrier warping problem because the bending forces on each side of the Cu heat sink plate are substantially equal and directed in opposing directions.

The supplemental substrate preferably has as many physical characteristics of the primary substrate as possible to better match the CTE of the primary substrate and may include a Cu core layer commonly found in the primary substrate. More preferably, the supplemental substrate may be constructed from the same organic material as the primary substrate. As with the primary substrate the supplemental substrate may be attached to the Cu heat sink plate using adhesives such as epoxy based adhesives, acrylic, or pre-preg.

The supplemental substrate may also be provided with a hole 58 to expose a portion of the Cu heat sink plate to improve heat dissipation, if necessary. A set of cooling fins (not shown) or other appropriate supplemental heat dissipation devices may also be attached to the exposed portion of the Cu heat sink to further improve heat dissipation.

It is to be appreciated that although the primary function of the supplemental substrate is a structural one, the supplemental substrate may also be configured and adapted to have other functions. For example, the supplemental substrate structure may be provided with appropriate electrical wiring features, such as signal wiring or ground and signal plane structures to provide the chip carrier with additional interconnection features if necessary.

The invention is applicable to BGA chip carriers in cavity die-attach format having organic substrates constructed from BT as well as other organic materials such as FR4, polyimide, polytetrafluoroethlyne, etc. The invention is also applicable to chip carriers having heat sink plates constructed from Cu or other metal or metal alloys such as Al or Cu—W. Furthermore, the invention is applicable to any chip carrier whose heat sink plate has a CTE that is sufficiently different from the CTE of the primary substrate causing the chip carrier to warp.

Figure 2:
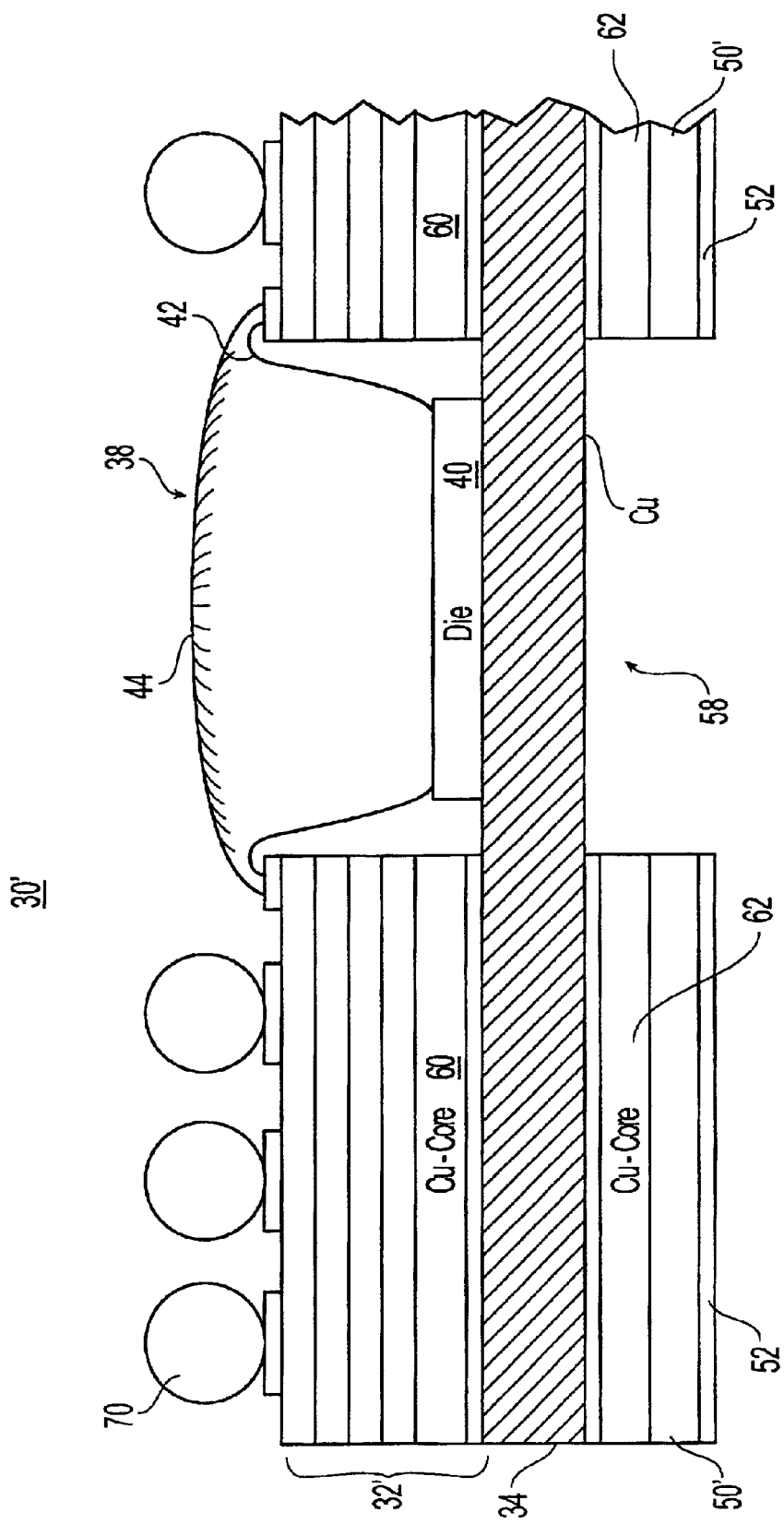
FIG. 2 illustrates a cross-sectional view of another embodiment of a semiconductor chip carrier having the symmetric structure according to the present invention.

FIG. 2 illustrates another embodiment of the invention, where, the primary substrate 32' has a Cu core 60. In this embodiment, supplemental substrate 50' may also be provided with a Cu core 70. Supplemental substrate 50' may also be provided with a Cu—Ni finish layer 52 for device marking purposes. Manufacturer's name, logo, part number, etc. may be marked on the Cu—Ni finish layer.

Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the appended claims and their equivalents.

I claim:

1. A semiconductor chip carrier comprising:
    a primary substrate;
    a metal heat sink plate, whose thermal coefficient of expansion is substantially different from that of said primary substrate, having a first side and an opposing second side where said primary substrate is attached to said first side;
    a supplemental substrate being attached to said second side of said metal heat sink plate, wherein said metal heat sink plate is between said primary substrate and said supplemental substrate; and
    said supplemental substrate is constructed from a material having a substantially similar coefficient of thermal expansion as that of said primary substrate so that the presence of the supplemental substrate prevents the semiconductor chip carrier from warping.

2. A semiconductor chip carrier according to claim 1, wherein said supplemental substrate is constructed from a same material as said primary substrate.

3. A semiconductor chip carrier according to claim 1, wherein said primary substrate is constructed from a material selected from one of Bis-malesimide triazine epoxy, FR4, polyimide, and polytetrafluoroethylene.

4. A semiconductor chip carrier according to claim 1, wherein said chip carrier is a ball-grid array chip carrier.

5. A semiconductor chip carrier according to claim 1, wherein said metal heat sink plate consists of a metal selected from one of Cu, Cu—W, Al, and alloys thereof.

6. A semiconductor chip carrier according to claim 1, wherein said supplemental substrate has a Cu—Ni finish layer.

7. A semiconductor chip carrier according to claim 1, wherein said supplemental substrate has a cavity exposing a portion of said metal heat sink plate.

8. A semiconductor chip carrier according to claim 1, wherein said primary substrate comprises a hole forming a die-attach cavity wherein the semiconductor chip is attached to the first side of the metal heat sink plate within the die-attach cavity.

* * * * *